United States Patent [19]
Bendik et al.

[11] Patent Number: 5,989,763
[45] Date of Patent: Nov. 23, 1999

[54] CHEMICAL GAS ANALYSIS DURING PROCESSING OF CHEMICALLY AMPLIFIED PHOTORESIST SYSTEMS

[75] Inventors: Joseph Bendik, Sunnyvale, Calif.; Andrew R. Romano, Pittstown, N.J.; Nickhil Jakatdar, Albany, Calif.

[73] Assignee: National Semicondustor Corporation, Santa Clara, Calif.

[21] Appl. No.: 09/086,320

[22] Filed: May 28, 1998

[51] Int. Cl.⁶ .................................................. G03F 9/00
[52] U.S. Cl. .............................. 430/30; 430/311; 430/330
[58] Field of Search ............................... 430/30, 311, 330

[56] References Cited

U.S. PATENT DOCUMENTS 5,789,124  8/1998  Todd ............................................ 430/30

OTHER PUBLICATIONS

Davidson, T., ACS Symposium Series 242 Polymers in Electronics, American Chemical Society, Washington, D.C. (1984).

Mack, C.A., *"Inside PROLITH, A Comprehensive Guide to Optical Lithography Simulation"*, by FINLE Technologies, Inc., pp. 76–80.

"Commercial DUV Photoresist Systems", Clariant Photoresist Product Flyer (1 pg.).

"Negative DUV Photoresist Chemistry", Clariant Photoresist Product Flyer (1 pg.).

Mertesdorf, C., et al., "Structural Design of Ketal and Acetal Blocking Groups in 2–Component Chemically Amplified Positive DUV Resists", SPIE vol. 2438, pp. 84–98.

*Primary Examiner*—Christopher G. Young
*Attorney, Agent, or Firm*—Limbach & Limbach L.L.P.

[57] ABSTRACT

Gases evolved during photolithographic processing of chemically amplified photoresist systems are monitored to allow optimization of process parameters such as intensity and duration of applied heat or radiation. Specifically, during soft bake, evaporation of solvent gases is detected. During exposure and PEB, gases evolved during activation of the polymer resin component by the photoacid are detected. The intensity and/or duration of the heating or exposure are then varied to optimize resolution of the particular photolithography process. Residual gas analysis, diode laser spectroscopy, FT-IR spectroscopy, and electronic sensing may be utilized alone or in combination to monitor composition and/or concentration of evolved gases in accordance with the present invention.

18 Claims, 3 Drawing Sheets

CHEMICAL GAS ANALYSIS DURING PROCESSING OF CHEMICALLY AMPLIFIED PHOTORESIST SYSTEMS

BACKGROUND OF THE INVENTION

1. Field of the Invention

The present invention relates to methods and apparatuses for controlling the reaction of photoresist during semiconductor fabrication processes, and, more particularly, to controlling the reaction of chemically-amplified photoresist by analyzing the concentration of gas evolved during soft baking, exposure, and/or post-exposure baking steps.

2. Description of the Related Art

Photoresist materials have long enjoyed widespread use in the field of semiconductor fabrication. One form of photoresist technology utilized in conjunction with deep UV lithography is known as chemically-amplified resist (CAR).

Chemically-amplified photoresist systems are generally composed of 1) a polymer resin and 2) a photoacid generator (PAG), and may also include 3) a crosslinking agent, dye, or other additive.

CAR photoresist systems generally operate in the following manner. A nonactivated polymer resin is initially combined with a photoacid generator. Exposure of the photoacid generator to deep UV radiation changes the photoacid generator into a photoacid. The photoacid then triggers an activation reaction involving the polymer resin.

In the case of a positive CAR photoresist system, the photoacid catalyzes the deprotection of blocking groups on the polymer resin, increasing the polarity of the resin and hence, its solubility in aqueous base. Thus, the activation reaction for a positive CAR photoresist converts a nonpolar, insoluble polymer resin into a polar, soluble polymer resin.

In the case of a negative CAR photoresist system, the photoacid reacts with a cross-linking agent to trigger cross-linking between adjacent polymer chains. Thus, the activation reaction for a negative CAR photoresist system converts a single-chain, soluble polymer resin into a cross-linked, insoluble polymer resin.

FIG. 1 illustrates the sequence of process steps typically utilized in a CAR system. During the first spin-coat step, the multi-component photoresist mixture within a solvent carrier is dispensed onto a silicon wafer surface as the wafer is rapidly spun. The solvent carrier is typically propylene glycol monomethyl ether acetate (pgmea). The wafer is spun until the solvent carrier is substantially removed and the mixture dries as a film of uniform thickness over the entire surface.

The second photolithography step utilized in a CAR system is the soft bake. During soft baking, additional remaining solvent carrier is removed from the spun-dried photoresist mixture. The photoresist coated wafer is heated to approximately the glass-transition temperature $T_g$ of the nonactivated resin, such that excess solvent is driven off and the photoresist hardens.

The third step in the CAR process is exposure of the dried photoresist mixture to deep UV radiation (typically 193 nm or 248 nm). The exposure step requires utilization of complex photolithography equipment and precise masking techniques in order to ensure precise application of radiation only to those portions of photoresist intended to be exposed.

The fourth step in a deep UV photolithography process is the post-exposure bake (PEB). During the PEB, the photoresist is again subjected to temperatures on the order of $T_g$. Thermal energy applied to the photoresist during the PEB causes the photoacid to diffuse within the resin. The diffusion of the photoacid fully activates the polymer resin in regions exposed to deep UV light, and also dampens any standing wave effects at the edges of exposed photoresist regions.

The fifth step associated with the CAR process-sequence is development. During development, an aqueous base solution is added to the exposed and baked photoresist, and a portion of the resin dissolves. Depending upon whether the CAR system is positive or negative, either activated or nonactivated polymer resin is dissolved in the aqueous base and removed.

After CAR photolithographic processing, the carefully created photoresist pattern serves to selectively mask etching of the silicon to form semiconducting structures having extremely precise shapes and sizes.

FIG. 2 illustrates the chemical reaction sequence of one exemplary positive CAR system. In the reaction sequence shown in FIG. 2, a photoacid generator consisting of triphenyl sulfonium salt 2 of trifluoroacetic acid is introduced into a mixture of nonpolar, aqueous base insoluble t-butoxycarbonyl (t-BOC)-substituted styrene 4 within a solvent consisting of pgmea. Exposing salt 2 to deep UV radiation causes disassociation of the triphenyl sulfonium to produce the photoacid trifluoroacetic acid 6.

Trifluoroacetic acid 6 then causes conversion of the nonpolar t-BOC group of styrene 4 into a polar hydroxy group. Subsequent heating of the mixture during a PEB step further enhances the rate of the conversion reaction. The resulting polyhydroxystyrene 8 is very polar.

Polyhydroxystyrene 8 present in photoresist regions exposed to deep UV radiation can be readily removed by dissolution in an aqueous base solution during the development step, to yield the desired pattern of photoresist.

Carbon dioxide 12 and isobutene 10 are side products of the conversion reaction of t-BOC substituted styrene 4 into polyhydroxystyrene 8. Both carbon dioxide 12 and isobutene 10 are volatile gases that diffuse into the air above the surface of the photoresist-coated wafer as activation reaction of the polymer resin proceeds to completion.

One limitation of current CAR processes is the difficulty in monitoring the amount of the solvent carrier and other materials driven from the spin coated wafer during the soft bake step. Overheating the photoresist mixture during the soft bake can cause degradation in the polymer resin or the PAG, hampering subsequent steps in the process.

On the other hand, underheating the photoresist mixture during the soft bake can result in excessive solvent remaining in the mixture. Excess solvent can cause problems during subsequent steps by altering the rate of generation of acid by the PAG, and/or by altering the rate of activation of the polymer by the acid.

Therefore, it is desirable to design methods and apparatuses that allow the extent of removal of solvent from a CAR coated photoresist wafer to be monitored and controlled during the soft bake step.

Another limitation in current CAR processes is that photoacid catalyzed conversion of the polymer resin cannot readily be monitored during the exposure or PEB steps.

Depending upon the CAR photoresist system utilized, activation of the polymer resin can occur predominantly either during the exposure step or the PEB step. Some CAR photoresist systems, such as the T-Boc protected polymer described above, are high activation energy systems. This means that even after $H^+$ is generated by the PAG during exposure, additional thermal energy is required to initiate activation. This thermal energy is provided by the PEB step.

Other CAR photoresist systems, such as those utilizing acetal protection, are low activation energy systems. This means that once $H^+$ is generated during exposure by the PAG, significant activation of the polymer resin takes place even in the absence of additional thermal energy.

With either high or low activation energy type systems, inability to ascertain the extent of activation of the polymer resin can create serious problems during subsequent development. For example, overexposing the wafer or overheating during PEB can result in excessive diffusion of the photoacid, causing the photoacid to migrate out of exposed regions of the photoresist into outlying, unexposed regions of the photoresist. Such excessive diffusion of the photoacid effectively degrades the resolution of the exposure. Excessive heating during PEB can also trigger unwanted cross-linking of the polymer resin, or deprotection of resin in locations not exposed to UV radiation. The above referenced phenomena create problems both in absolute terms, and in terms of maintaining consistency of critical dimension (CD) linewidth between different lots of wafers.

On the other hand, underexposing the wafer or underheating during PEB can produce excessively limited diffusion of the photoacid, causing inadequate activation of the polymer resin in exposed regions of the photoresist mixture. This can result in either too much or too little photoresist remaining after development, again adversely affecting the CD linewidth of etched features.

Therefore, it is desirable to design methods and apparatuses that allow activation of the polymer resin component of a CAR system to be monitored during the exposure and PEB steps.

SUMMARY OF THE INVENTION

The present invention relates to monitoring the composition and concentration of gases evolved during CAR photolithographic processing. Specifically, the methods and devices in accordance with the present invention utilize one or more analytical processes to monitor the composition and concentration of gases evolved during the soft bake, exposure, and/or PEB steps. During soft bake, the composition and concentration of solvent gases are monitored. During exposure and PEB, the composition and concentration of gases produced by activation of the resin are monitored.

Analytical methods suitable for use in accordance with the methods and apparatuses of the present invention include but are not limited to: 1) residual gas analysis; 2) diode laser spectroscopy; 3) FT-IR spectroscopy; and 4) electronic sensing. The above techniques may be utilized alone or in combination.

The present invention enables the user to carefully monitor the progress of the soft bake, exposure, and/or PEB photolithographic processing steps. In this manner, crucial parameters such as duration and intensity of the exposure of the wafer to 1) thermal energy or 2) radiation can be fine-tuned, optimizing effectiveness of a particular CAR system.

A first embodiment of a baking apparatus in accordance with the present invention comprises a bake chamber including a wafer support, a heating element, and an exhaust port, and also comprising a reaction control means in communication with the heating element, such that the reaction control means monitors concentrations of gas evolved by the chemically amplified resist during baking and varies thermal output of the heating element in order to optimize the baking.

A first embodiment of a method for optimizing activation of a polymer resin of a chemically-amplified photoresist system comprises the steps of exposing a semiconductor wafer coated with a polymer resin to deep UV radiation, heating the semiconductor wafer within a baking device, detecting the concentration of a gas evolved from the semiconductor wafer, and adjusting the heating in response to the detected gas concentration in order to optimize activation of the polymer resin.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
FIG. 1 illustrates the general sequence of steps of a photolithography process utilizing a chemically-amplified resist system.
Figure 2:
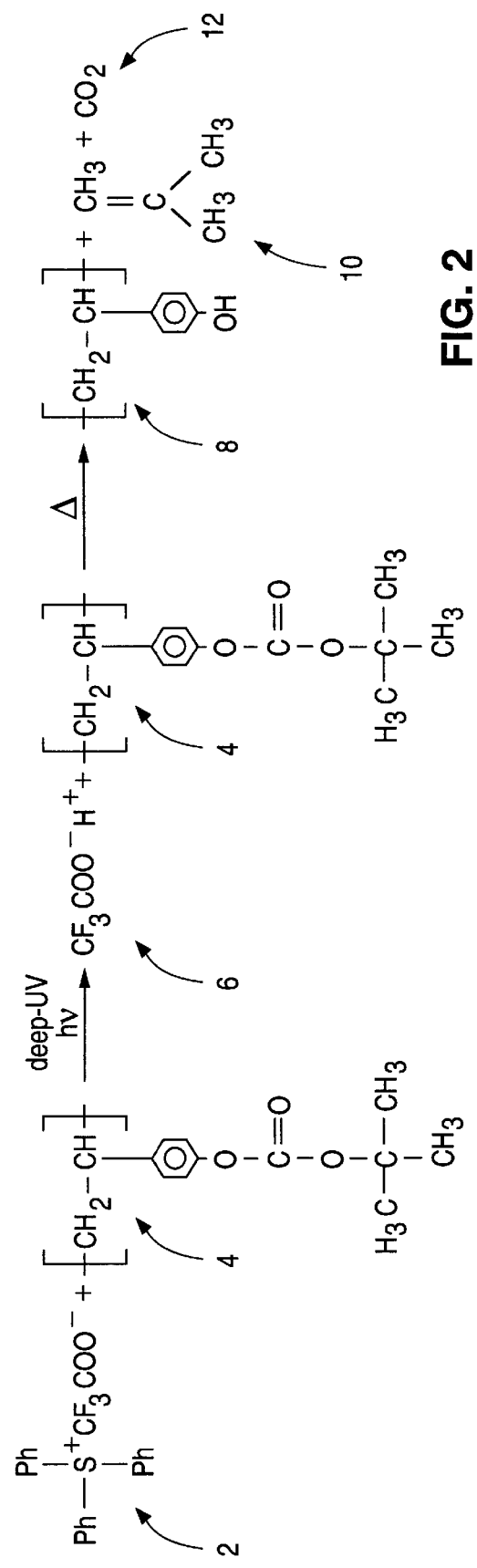
FIG. 2 illustrates the reaction sequence of one specific positive CAR system.
Figure 3:
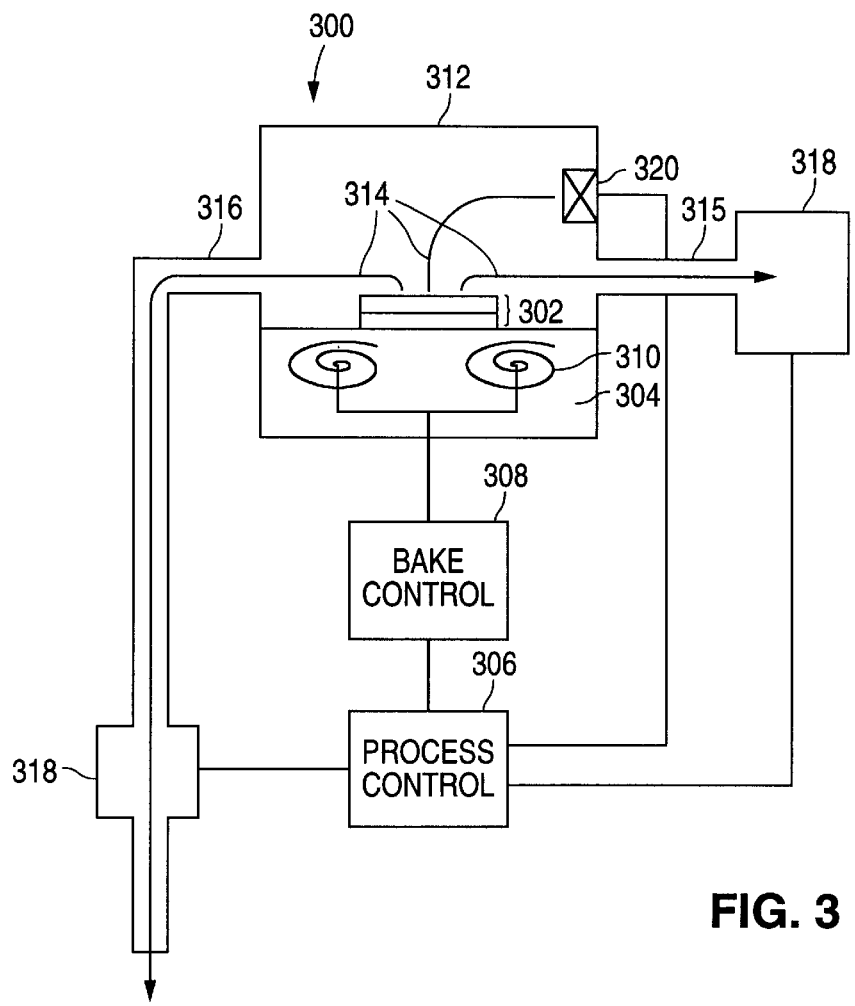
FIG. 3 illustrates a baking apparatus permitting gas analysis of chemically amplified resist in accordance with a first embodiment of the present invention.

FIG. 3 illustrates a baking apparatus permitting gas analysis of chemically amplified resist in accordance with a first embodiment of the present invention. Baking device 300 receives and holds silicon wafer 302 coated with a spun-dried CAR photoresist mixture on top of wafer support 304 located within baking chamber 312.

During heating, process controller 306 instructs bake controller 308 to cause heating elements 310 within wafer support 304 to raise the temperature within bake chamber 312. As bake chamber 312 heats up, gas 314 is evolved from the surface of silicon wafer 302.

When wafer 302 is heated during the soft bake step, the gas 314 evolved is a solvent that remained in the photoresist mixture following the prior spin coating step. When wafer 302 is heated during the PEB step, the gas 314 evolved may include solvent and/or by-products of the activation reaction of the polymer resin component of the photoresist system.

Gas 314 is removed from baking chamber 312 into gas exhaust port 316. As shown in FIG. 3, some of the evolved gas 314 may be transported to passive sampling port 315.

Either or both exhaust port 316 or passive sampling port 315 may be linked to a gas analysis module 318. Gas analysis module 318 subjects gas 314 to one or more analytical techniques, including but not limited to: 1) residual gas analysis; 2) spectroscopy by diode lasers; 3) FT-IR spectroscopy; and 4) electronic sensing.

The results of analysis by the module 318 are fed to process controller 306. Process controller 306 determines whether the result of this analysis dictates either the continued application of thermal energy, or the cessation of heating. Process controller 306 then instructs bake controller 308 to accordingly activate or deactivate heating elements 310.

Figure 4:
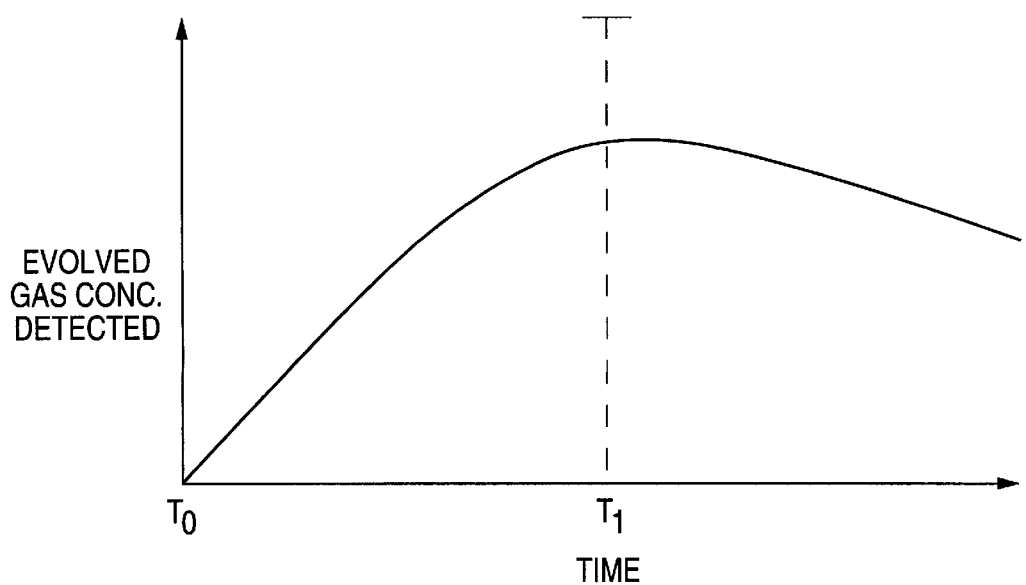
FIG. 4 plots detected evolved gas concentration versus time during a baking step.

A typical gas evolution profile is depicted in FIG. 4. FIG. 4 plots evolved gas concentration versus time. At time T₀, the wafer is first subjected to heating. Between $T_0$ and $T_1$, evolved gas is detected above the wafer surface in increasing amounts. At time $T_1$, the rate of gas evolution levels off or decreases. This inflection at time $T_1$ may indicate the appropriate time to halt the baking step.

Residual gas analysis (RGA) is the first of the listed analytical techniques suitable for detection of the composition and/or concentration of evolved gas. RGA subjects the evolved gas to a separation of individual components followed by mass spectroscopy.

The second of the analytical techniques mentioned above is laser diode spectroscopy. Laser diode spectroscopy involves the application of coherent radiation from a combination of sources to a gas sample. By utilizing this technique, both the identity and concentration of gas evolved by the photoresist can be measured.

Alternatively or in conjunction with either the RGA or the laser diode spectroscopy described above, gas evolved from the wafer may also be exposed to infrared radiation, and the spectra obtained subjected to fourier transformation techniques (FT-IR). Data from the FT-IR can be fed directly back to process controller 306 to control the application of thermal energy by heating elements 310. One example of a FT-IR device suitable for use with the present invention is the Series 2301 FT-IR thin film monitor sold by On-Line Technologies, Inc., of East Hartford, Conn.

In addition, many of the gases evolved from a CAR coated wafer during photolithographic processing are susceptible to detection by custom-built electronic sensors. While the mode of operation of each such sensor varies, in general these devices determine gas concentrations by measuring changes in electrical resistance or capacitance. In such devices, changes in the resistive or capacitive character of a structure can be calibrated under a variety of concentrations of a particular gas.

A wide variety of volatile gases may be evolved from the wafer depending upon the nature of the solvent carrier, polymer resin, or photoacid generator. Thus, the relative usefulness of the analytical methods utilized to determine the concentration of such gases will vary according to the particular application.

Table 1 lists some of the general classes of gases that are evolved during soft bake, exposure, and PEB processing steps. Detection of the presence and concentration of these gases may be useful in order to determine the extent of removal of solvent, and/or the extent of activation of the polymer resin.

TABLE 1

| PROCESS STEP | GASES EVOLVED |
| --- | --- |
| Soft Bake | pgmea, water, volatile amine-containing compounds |
| Exposure | pgmea, water, carbon dioxide, alcohols, hydrocarbons, aldehydes |
| PEB | pgmea, water, volatile amine-containing compounds, carbon dioxide, alcohols, aldehydes, vinyl ether, sulfides, hydrocarbons |

Figure 5:
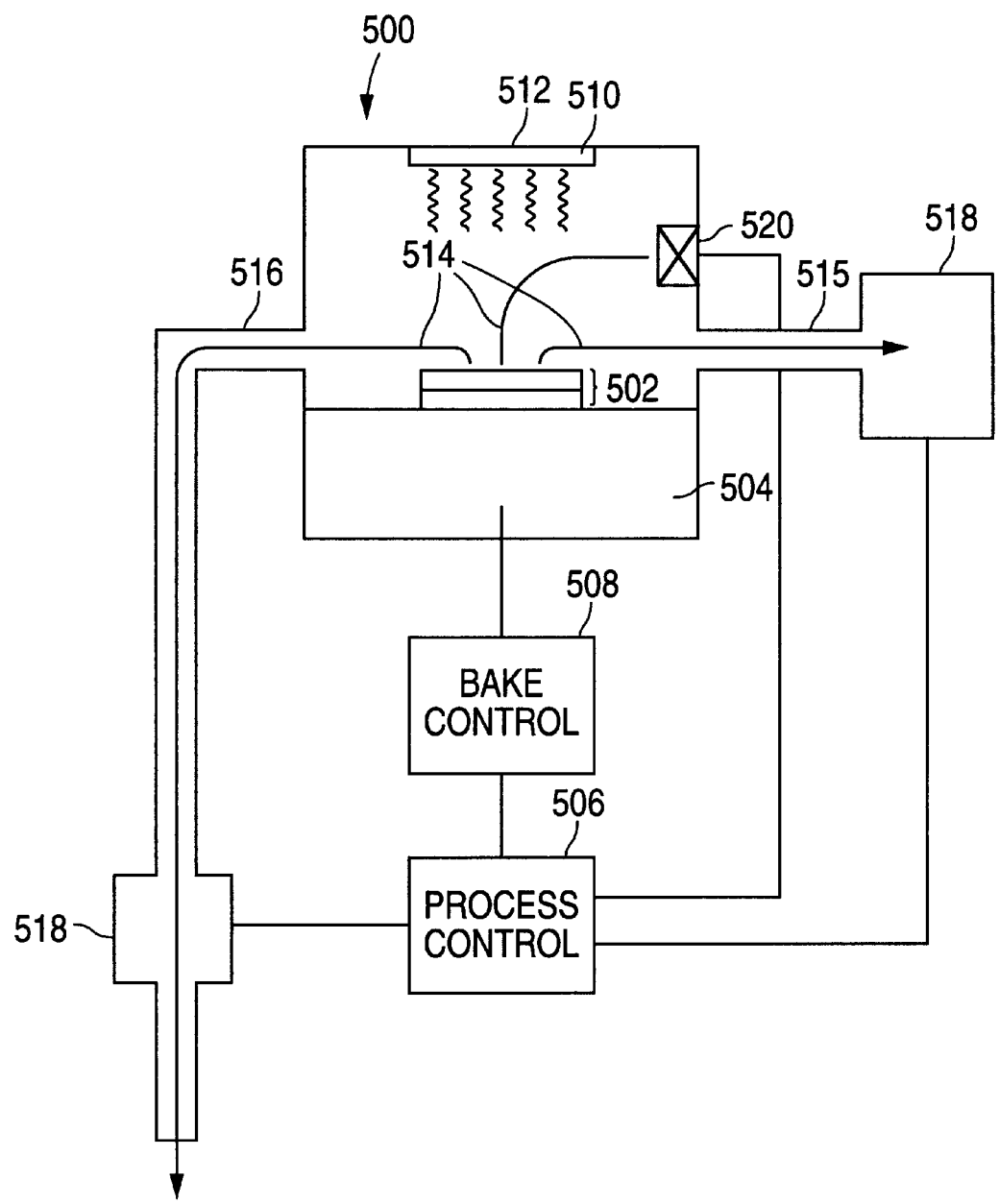
FIG. 5 illustrates an exposure apparatus permitting gas analysis of chemically amplified resist in accordance with a second embodiment of the present invention.

While a heating apparatus is shown in FIG. 3, the present invention also encompasses detection of evolved gases in an exposure device during the application of radiation to the wafers. FIG. 5 illustrates an exposure apparatus permitting gas analysis of chemically amplified resist in accordance with a second embodiment of the present invention.

Exposure device 500 receives and holds silicon wafer 502 coated with a spun-dried CAR photoresist mixture on top of wafer support 504 located within exposure chamber 512.

During exposure, process controller 506 instructs exposure controller 508 to cause radiation source 510 within exposure chamber 512 to irradiate wafer 502. As wafer 502 is exposed to radiation, gas 514 that is a by-product of the activation reaction of the polymer resin component of the photoresist system may be evolved from the surface of the wafer.

Gas 514 is removed from exposure chamber 512 through gas exhaust port 516. As shown in FIG. 5, some of the evolved gas 514 may be transported to passive sampling port 515.

Either or both exhaust port 516 or passive sampling port 515 may be linked to a gas analysis module 518. Gas analysis module 518 subjects the gas 514 to one or more analytical techniques, including but not limited to: 1) residual gas analysis; 2) spectroscopy by diode lasers; 3) FT-IR spectroscopy; and 4) electronic sensing.

The results of analysis by the module 518 are fed to process controller 506. Process controller 506 determines whether the result of this analysis dictates either the continued application of radiation to the wafers, or the cessation of exposure. Process controller 506 then instructs bake controller 508 to accordingly activate or deactivate heating elements 510.

The specific baking and exposure devices depicted in FIGS. 3 and 5 respectively, represent particular embodiments of an apparatus in accordance with the present invention. For example, in addition to performing analysis upon exhaust gas or gas transported to a passive port, an apparatus or method may perform analysis upon gas evolved directly above the wafer surface and still remain within the scope of the present invention.

Therefore, it is intended that the following claims define the scope of the present invention, and that the methods and structures within the scope of these claims and their equivalents be covered hereby.

What is claimed is:

1. A method for optimizing activation of a polymer resin of a chemically-amplified photoresist system, the method comprising the steps of:

exposing a semiconductor wafer coated with a polymer resin to deep UV radiation;

heating the semiconductor wafer within a baking device;

detecting the concentration of a gas evolved from the semiconductor wafer; and adjusting the heating in response to the detected gas concentration in order to optimize activation of the polymer resin.

2. The method of claim 1 wherein the gas concentration is determined by performing at least one of FT-IR spectroscopy, diode laser spectroscopy, residual gas analysis, and electronic sensing.

3. The method of claim 2 wherein the concentration of a gas selected from the group consisting of polyethylene glycol methyl acetate, water, volatile amine-containing compounds, carbon dioxide, alcohols, aldehydes, vinyl ether, sulfides, and hydrocarbons is detected during heating.

4. The method of claim 3 wherein detection of the evolved gas concentration is performed directly above the surface of the semiconductor wafer.

5. The method of claim 3 wherein detection of the evolved gas concentration is performed upon gases present in an exhaust port of the baking device.

6. The method of claim 3 wherein detection of the evolved gas concentration is performed upon gases present in a passive sampling port of the baking device.

7. A method for optimizing activation of a polymer resin of a chemically-amplified photoresist system, the method comprising the steps of:

exposing a semiconductor wafer coated with a polymer resin to deep UV radiation within an exposure device;

detecting the concentration of a gas evolved from the semiconductor wafer; and adjusting radiation exposure in response to the detected gas concentration in order to optimize activation of the polymer resin.

8. The method of claim 7 wherein the gas concentration is determined by performing at least one of FT-IR spectroscopy, diode laser spectroscopy, residual gas analysis, and electronic sensing.

9. The method of claim 8 wherein the concentration of a gas selected from the group consisting of polyethylene glycol methyl acetate, water, volatile amine-containing compounds, carbon dioxide, alcohols, aldehydes, vinyl ether, sulfides, and hydrocarbons is detected during radiation exposure.

10. The method of claim 9 wherein detection of the evolved gas concentration is performed directly above the surface of the semiconductor wafer.

11. The method of claim 9 wherein detection of the evolved gas concentration is performed upon gases present in an exhaust port of the exposure device.

12. The method of claim 9 wherein detection of the evolved gas concentration is performed upon gases present in a passive sampling port of the exposure device.

13. A method for optimizing removal of solvent from a chemically-amplified photoresist system, the method comprising the steps of:

spin coating a semiconductor wafer with a chemically-amplified photoresist system including a solvent, a polymer resin, and a photoacid generator;

heating the spin coated semiconductor wafer to approximately a glass transition temperature of the polymer resin within a baking chamber; and detecting the concentration of gas evolved from the chemically amplified photoresist system during heating; and adjusting the heating in response to the detected gas concentration in order to optimize evaporation and removal of the solvent.

14. The method of claim 13 wherein the gas concentration is determined by performing at least one of FT-IR spectroscopy, diode laser spectroscopy, residual gas analysis, and electronic sensing.

15. The method of claim 14 wherein the concentration of a gas selected from the group consisting of polyethylene glycol methyl acetate, water, volatile amine-containing compounds, carbon dioxide, alcohols, aldehydes, vinyl ether, sulfides, and hydrocarbons is detected during heating.

16. The method of claim 15 wherein detection of the evolved gas concentration is performed directly above the surface of the semiconductor wafer.

17. The method of claim 15 wherein detection of the evolved gas concentration is performed upon gases present in an exhaust port of the baking chamber.

18. The method of claim 15 wherein detection of the evolved gas concentration is performed upon gases present in a passive sampling port of the baking chamber.

* * * * *

UNITED STATES PATENT AND TRADEMARK OFFICE
CERTIFICATE OF CORRECTION

PATENT NO.: 5,989,763
DATED: November 23, 1999
INVENTOR(S): Joseph Bendik et al.

It is certified that an error appears in the above-identified patent and that said Letters Patent is hereby corrected as shown below:

On the Cover Page at [73], delete "National Semicondustor Corporation" and replace with --National Semiconductor Corporation--.

Signed and Sealed this

Thirtieth Day of May, 2000

*Attest:*

Q. TODD DICKINSON

*Attesting Officer*      *Director of Patents and Trademarks*